US011621045B2

(12) United States Patent
Yang (10) Patent No.: US 11,621,045 B2
(45) Date of Patent: Apr. 4, 2023

(54) NON VOLATILE FLASH MEMORY WITH IMPROVED VERIFICATION RECOVERY AND COLUMN SEEDING

(71) Applicant: Intel Corporation, Santa Clara, CA (US)

(72) Inventor: Xiang Yang, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/808,955

(22) Filed: Mar. 4, 2020

(65) Prior Publication Data

US 2021/0280261 A1    Sep. 9, 2021

(51) Int. Cl.
| | | |
|---|---|---|
| *G11C 16/34* | (2006.01) | |
| *G06F 3/06* | (2006.01) | |
| *G11C 16/04* | (2006.01) | |

(52) U.S. Cl.
CPC ........ *G11C 16/3459* (2013.01); *G06F 3/0604* (2013.01); *G06F 3/0659* (2013.01); *G06F 3/0679* (2013.01); *G11C 16/3427* (2013.01); *G11C 16/0483* (2013.01)

(58) Field of Classification Search
None
See application file for complete search history.

(56) References Cited

U.S. PATENT DOCUMENTS

| | | | | |
|---|---|---|---|---|
| 10,636,498 B1* | 4/2020 | Lien | .................... | G11C 16/3459 |
| 2006/0245251 A1* | 11/2006 | Shirota | .............. | G11C 16/0483 |
| | | | | 365/185.17 |
| 2009/0097318 A1* | 4/2009 | Sarin | .................. | G11C 16/0483 |
| | | | | 365/185.17 |
| 2009/0310414 A1* | 12/2009 | Lee | ...................... | G11C 11/5635 |
| | | | | 365/185.17 |
| 2017/0069391 A1* | 3/2017 | Lee | ........................ | G11C 16/10 |
| 2017/0076814 A1* | 3/2017 | Hashimoto | ....... | H01L 27/11582 |
| 2017/0286327 A1* | 10/2017 | Zhang | ................. | G06F 13/4068 |
| 2018/0261267 A1* | 9/2018 | Shimura | ............... | G11C 16/08 |
| 2018/0374541 A1* | 12/2018 | Jung | ...................... | G11C 16/10 |
| 2019/0318784 A1 | 10/2019 | Lee et al. | | |
| 2019/0378580 A1 | 12/2019 | Zhao et al. | | |
| 2020/0126623 A1* | 4/2020 | Lee | .................... | G11C 16/3427 |
| 2020/0342946 A1 | 10/2020 | Zhao et al. | | |
| 2021/0166773 A1* | 6/2021 | Xu | ......................... | G11C 16/10 |

OTHER PUBLICATIONS

Extended European Search Report for Patent Application No. 20208343.2, dated May 6, 2021, 9 pages.

* cited by examiner

*Primary Examiner* — J. H. Hur
(74) *Attorney, Agent, or Firm* — Compass IP Law PC (57) ABSTRACT

An apparatus is described. The apparatus includes a non volatile memory chip. The non volatile memory chip includes an interface to receive access commands, a three dimensional array of non volatile storage cells, and, a controller to orchestrate removal of charge in a column of stacked ones of the non volatile storage cells after a verification process that determined whether or not a particular cell along the column was programmed with a correct charge amount. The removal of the charge pushes the charge out of the column by changing respective word line potentials along a particular direction along the column. Cells that are coupled to the column are programmed in the particular direction. Disturbance of neighboring cells during programming is less along the particular direction than a direction opposite that of the particular direction.

17 Claims, 7 Drawing Sheets

Fig. 4

NON VOLATILE FLASH MEMORY WITH IMPROVED VERIFICATION RECOVERY AND COLUMN SEEDING

FIELD OF INVENTION

The field of invention pertains generally to the electrical arts, and, more specifically, to a non volatile flash memory with improved verification recovery and column seeding.

BACKGROUND

With the onset of "big-data", cloud-computing, artificial intelligence and other highly data intensive applications, the performance of non volatile memory is becoming an increasing focus of overall application performance because much of the data that is processed by these applications is ultimately read from and/or written to non volatile memory. As such, systems designers and non volatile memory chip and/or device designers are becoming increasingly focused on improving the performance of their non volatile memory chips and/or devices.

FIGURES

A better understanding of the present invention can be obtained from the following detailed description in conjunction with the following drawings, in which.

BACKGROUND

Figure 1A:
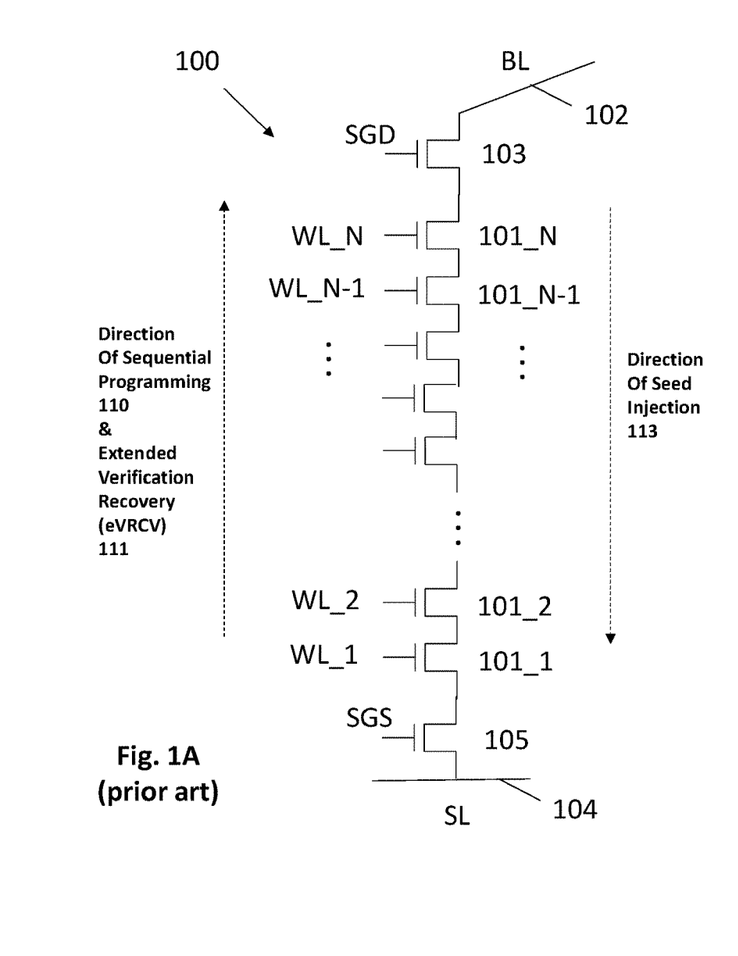
FIGS. 1A and 1B show prior art processes of a prior art flash memory.

FIG. 1A shows a stack of flash memory cells 100. As observed in FIG. 1A, the stack of flash memory cells 100 includes N transistors 101_1 through 101_N coupled along a vertical column whose respective gate structures correspond to individual storage elements. The column is accessed on the top side via a bit line (BL) 102 and source-gate-drain (SGD) transistor 103. Bias potentials are applied to the column through a bottom side source line (SL) 104 and a source-gate-source (SGS) transistor 105. Here, bottom is understood to mean closer to the semiconductor chip substrate and top is understood to mean farther away from the semiconductor chip substrate.

As is known in the art, flash memory is written to (technically referred to as "programming") in units of blocks. A single block includes an array of flash cell stacks, where, storage cells residing at a same vertical position are tied to a same word line. When reading from or writing to a particular page of information within a block, a particular word line in the block is activated which, in turn, activates the cells of the various stacks that are coupled to that word line. In the case of a read, the respective charges stored in the cells that are coupled to the activated word line influence the potential on their respective columns and bit lines which are then sensed to determine the read information (the cells that are not coupled to the activated word line are isolated from their respective columns).

In the case of a write ("program"), the respective bit lines of the stacks are charged consistently with the data to be programmed which, in turn, influences the potential of their respective columns. The cells that are coupled to the activated word line receive charge from their respective column which effectively programs these cells. The voltage placed on the activated word line is referred to as a "program voltage". The cells that are not coupled to the activated word line do not receive the program voltage and are isolated from their columns during the program operation.

Flash cells are programmed according to a "program-verify" process in which, after cells of a same word line are written to with new data using a particular word line voltage, the cells are then read back to confirm that each of their respective stored charge levels is consistent with the data that was intended to be written into them (verify). Those cells that fail (do not store sufficient charge) are then written to again but with a higher program voltage and again re-verified. Cells that pass are isolated from the re-write. The program-verify process then repeats successive iterations of program-verify operations with increasingly higher program voltage with each iteration until all cells that are tied to the activated word line are deemed to pass.

Generally, program operations are applied to an entire block. As such, the above described process is performed for each word line in the block on a word line by word line basis. In a conventional programming approach, the word line by word line programming approach is performed sequentially moving up the column 110.

That is, referring to FIG. 1A, cells coupled to the bottom most word line WL1 are first programmed according to the above described process. After the cells coupled to WL1 are fully programmed (all cells are deemed a pass after, e.g., successive program-verify iterations with increasing programming voltage applied to WL1 with each next program iteration), programming of cells coupled to WL2 begins. Cells coupled to WL2 are then programmed according to successive iterations of program-verify operations as described above. After all cells coupled to WL2 are deemed a pass, programming of cells coupled to WL3 begins. The process continues in sequence moving up the column in increasing word line order until cells coupled to the WL_N word line are fully programmed.

The verifying of cells in between the program sequences of the program-verify iterations can result in the presence of unwanted, residue electrons in the block's respective columns. As such, a process referred to as "extended verification recovery" (eVRCV) 111, 112 has been used as a final step of the verification sequence to remove these electrons.

In the case of traditional eVRCV, the block's word lines are driven to a low potential state in sequence moving up the columns from the bottom most word line to the top most word line 112. That is, first WL1 is driven to a low potential state, then, WL2 is driven to a low potential state, etc. Each lowering of word line potential drives electrons up the column away from the word line whose potential was just lowered. The lowering of word line potential then advances up the stack on a word line by word line basis. Ideally, when the potential of the topmost word line WL_N is finally lowered (with all lower word lines having their potential already lowered in sequence), all residue electrons that existed in the column after verification are pushed out of the column, onto the bit line 102 and subsequently absorbed.

Commensurate with the formally ending of eVRCV is the "priming" of the column for programming by injecting positive "seed" charge (absorbing negative electrons) into the column 113, 114. Traditionally, the seed charge is injected into the top of the stack from the bit line 102 via an active SGD transistor 115.

Thus, the traditional flash programming sequencing can be characterized as fully programming cells on a word line by word line basis moving up the column 110. That is, cells coupled to a next, immediately higher word line are not programmed until all cells of the current, immediately lower word line being programmed are deemed a "pass" after (typically) successive program-verify operations. Additionally, the succession of program-verify operations performed at each word line is characterized by performing "bottom-to-top" eVRCV 111, 112 as described above at the end of verification, and, injecting positive seed charge into the top of the column 113, 114, 115 from the bit line 102 just prior to programming at a next higher program voltage.

As is known in the art, a single flash cell is capable of storing more than two digital states to effect storage of more than one bit per cell. For example, in the case of quad level cell (QLC), each cell is capable of storing sixteen different charge levels which, in turn, corresponds to the storage of four digital bits per cell. In order to successfully store multiple charge levels per cell, the distribution of charge amongst the cells needs to be fairly tight or precise for a same stored digital value. That is, if a number of flash cells are to store a same digital value, their respective stored charges should be nearly identical (there is a narrow charge spread amongst them). If it were it otherwise, it would be difficult if not impossible to read and write multi-state values into many different storage cells.

Through an undesirable "disturb effect", the programming of a cell that is coupled to a particular word line can affect the stored charge levels of the cells that are coupled to its immediately neighboring word lines. The disturbance to the charge of the neighboring cells affectively increases the distribution/spread of charge across cells holding same values within the flash device.

Figure 1B:
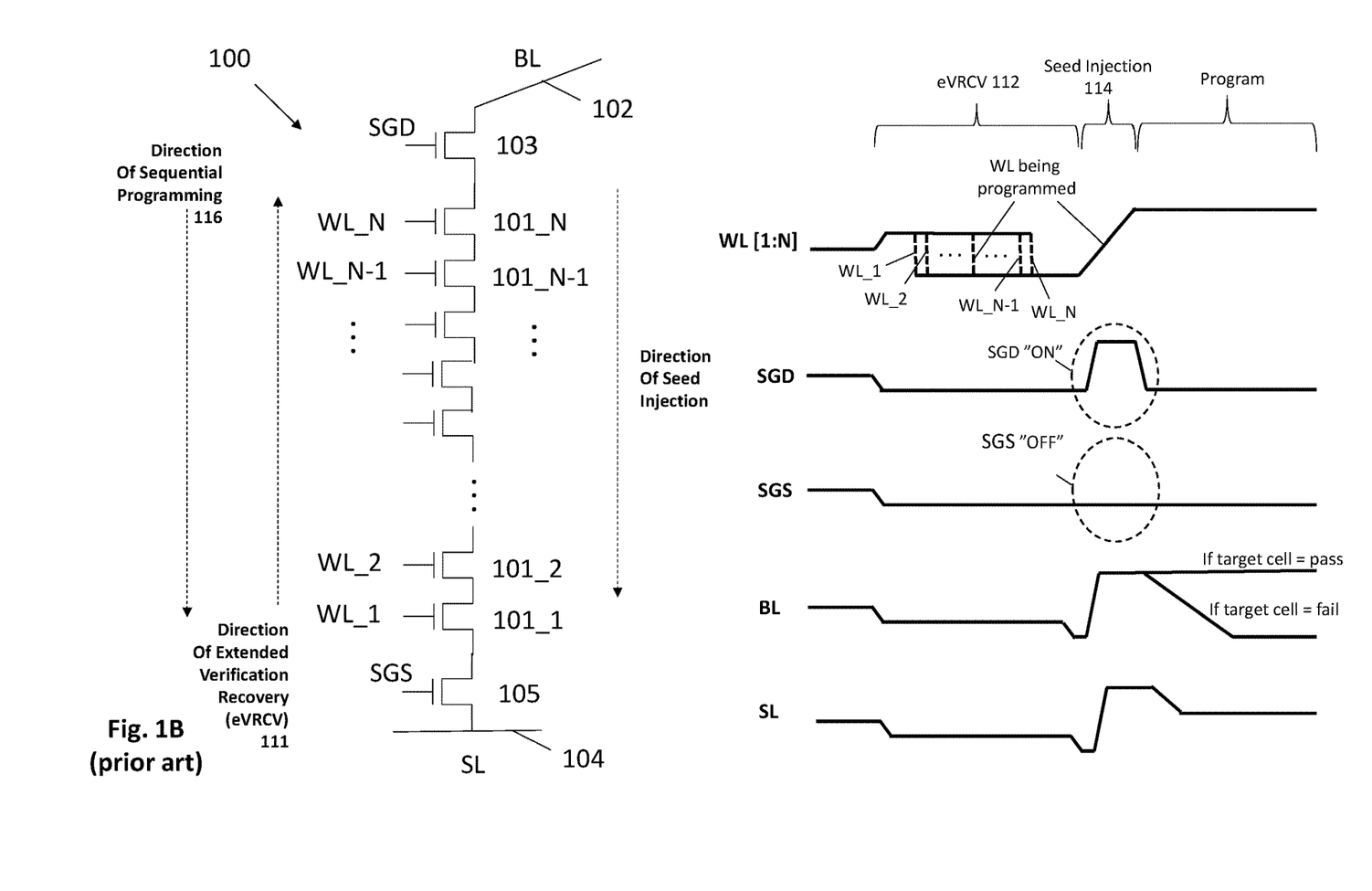

It has been observed, referring to FIG. 1B, that the disturb effect can be reduced if cells are programmed on a word line by word line basis from top to bottom 116 rather than from bottom to top. That is, whereas, the traditional programming approach described just above programmed on a word-line by word line basis starting from the bottom of the column and advancing upward, in the improved "reverse order" approach 116, cells coupled to the topmost word line (WL_N) are programmed first in the sequential order.

After a sequence of program-verify operations that results in the cells coupled to word line WL_N being fully programmed, the program operation then proceeds to program cells coupled to word line WL_N−1. Again, a sequence of program-verify operations are performed to the cells that are coupled to word line WL_N−1 until they are deemed fully programmed, at which point cells coupled to WL_N−2 begin to be programmed. The process then continues in succession with cells coupled to each next lower word line being programmed until cells coupled to the bottom most word line WL_1 are programmed.

According to known reverse order approaches, however, during the sequence of program-verify operations applied to any particular word line, the traditional extended verify operation is performed 111, 112. That is, as described at length above, at the end of each verification, electrons are pushed out of the column in the direction from the bottom of the column to the top of the column. To effect such electron movement, word line potentials are driven low in succession from the bottom most word line to the top most word line 112.

Unfortunately, if electrons are pushed out of the column in a bottom to top direction 111 during verification when reverse order programming is being applied 116, the electrons are pushed past cells that have already been fully programmed. That is, consider the initial programming of the cells that are coupled to the top most word line WL_N. Upon completion of the programming of these cells, and the following programming of cells coupled to the next lowest word line (WL_N−1), during the nominal bottom-to-top extended verify recovery sequence 111, 112, an attempt is made to push the electrons up the column past the already programmed cells that are coupled to WL_N.

Unfortunately, the charge levels that have been programmed into these cells (that are coupled to WL_N) can thwart the upward advancement of electrons up through the column. That is, the lowering of the potential of WL_N−1, by itself, can be insufficient to drive all electrons in the column past the cell coupled to the top word line WL_N and onto the bit line 102.

Figure 2A:
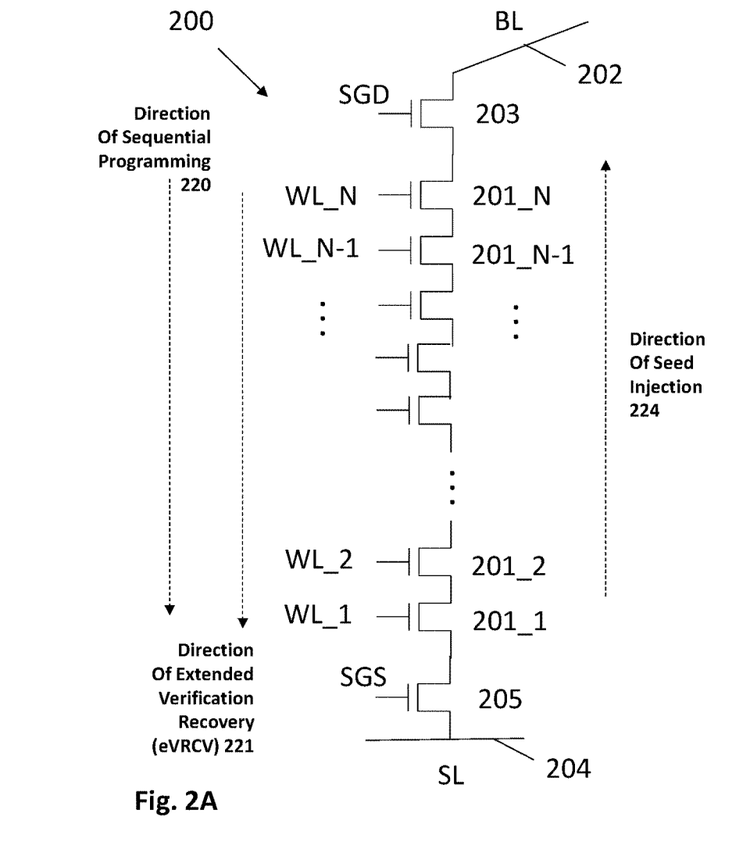
FIGS. 2A and 2B show processes of an improved flash memory.

A solution, referred to as "reverse extended verification recovery" (ReVRCV), is depicted in FIG. 2A. In the case of ReVRCV, at the end of verification, the column is cleansed of residue electrons by pushing electrons in a top-down rather than bottom-up direction 221, 222. That is, as observed in FIG. 2A, word line potentials are driven low in succession on a word line by word line basis starting with the top most word line (WL_N) and ending with the bottom most word line (WL_1) 222. By so doing, residue electrons in the column are easily pushed down the column 221 past lower cells that have not yet been programmed. Upon being pushed past the cell that is coupled to the WL_1 word line, the electrons are pushed out of the bottom of the column through an ON SGS transistor 223, onto the lower source line 204 and absorbed.

Recall from the discussion of FIGS. 1A and 1B that the priming 113, 114, 115 of the column with a positive seed charge is effected by causing the positive seed charge to enter the top of the column from the bit line 102. Unfortunately, if the overall block is programmed in reverse order 220 (programming is performed on a word line by word line basis in a top to bottom direction), seed charge that attempts to enter the top of the column from the bit line 202 can be thwarted as it attempts to move past upper cells that have already been programmed.

That is, again, when programming the stack in reverse order 220, cells coupled to upper word lines will be programmed ahead of cells that are coupled to lower word lines. As such, charge that attempts to enter the top of the column through the SGD transistor from the bit line 202 will need to pass by upper, already programmed cells in order to reach the region of the column where the cells that are yet to be programmed reside. Unfortunately, the stored charge levels of the already programmed upper cells can thwart the transfer of the positive charge as it attempts to flow through the upper region of the column from the bit line 202.

In order to overcome this problem, also observed in FIG. 2A, seed charge enters the bottom of the column from the source line 204 through an activated SGS transistor 223. That is, upon remnant electrons being pushed out of the column in a top-to-bottom direction 221 through the SGS transistor 205 and on to the source line 204 at the end of the reverse order extended verify recovery operation 221, 222, the column is seeded 224, 225 with positive charge that flows from the source line 204 through the on SGS transistor 223 and into the bottom of the column. Positive charge that enters the bottom of the column 224 in this manner in able to reach the region of the column where the next word line to be programmed resides without passing by cells that have already been programmed.

Figure 2B:
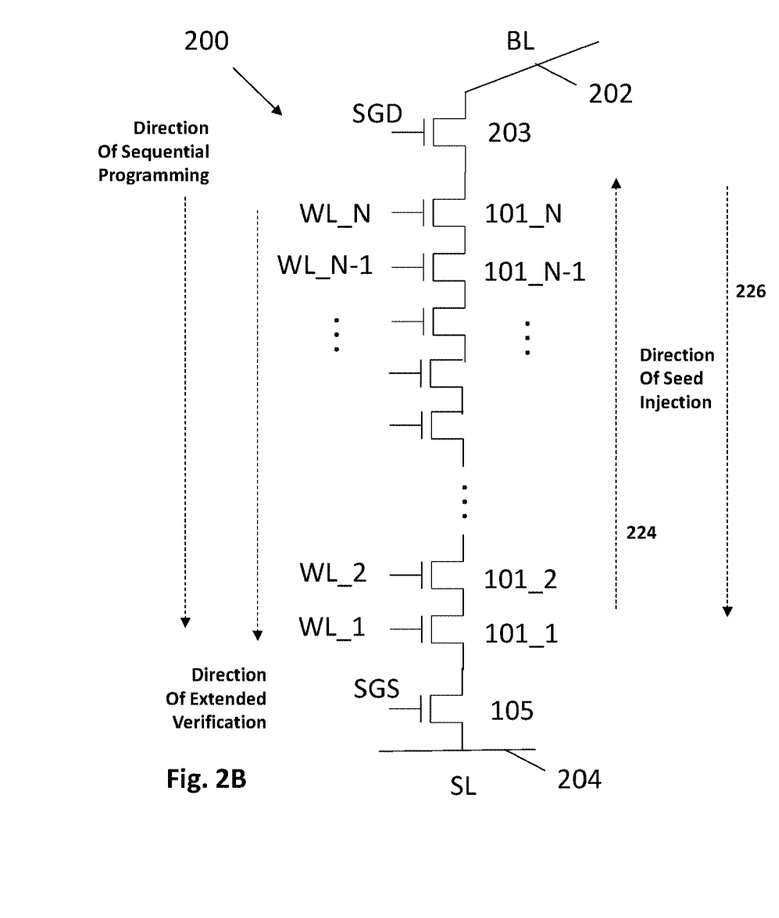

Finally, as observed in FIG. 2B, according to an additional embodiment, the seeding process can simultaneously attempt to send more seed charge into the top of the column 226 from the bit line 202 through an ON SGD transistor 228 as per the traditional approach. However, the injection efficiency is expected to be better with the bottom side injection than the top side injection for the reasons explained immediately above.

Figure 3A:
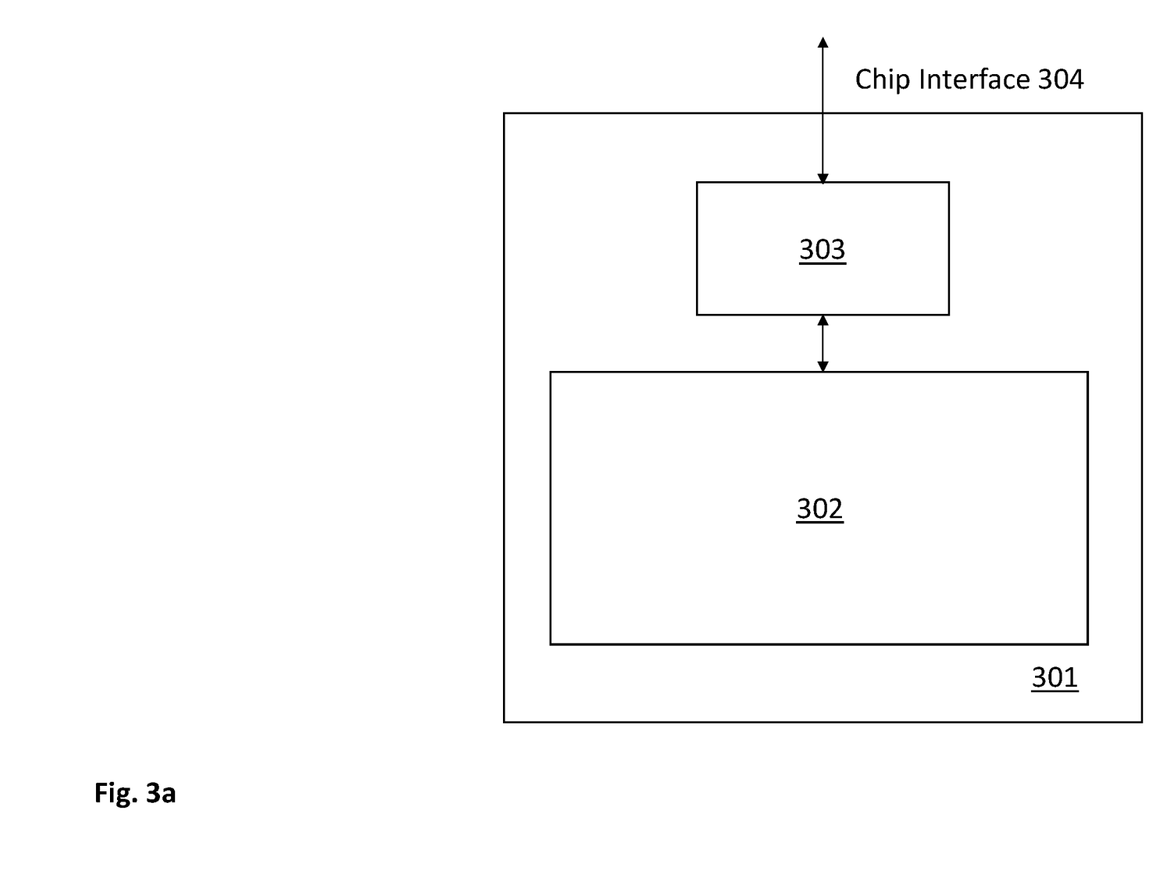
FIG. 3a shows a non volatile memory chip.

FIG. 3a shows a flash memory chip 301 having one or more arrays of stacked storage cells (a three dimensional array of storage cells) 302 and an embedded controller logic circuit (also referred to as the chip's controller) 303. The embedded controller logic circuit 303 is designed to program the stacks of storage cells in reverse order (top-to-bottom), and, perform top-to-bottom extended verification recovery and bottom side seeding (with or without top side seeding) on the stacks as described at length above. The chip interface 304 is commonly used to receive access commands from a controller of a non volatile memory device.

Figure 3B:
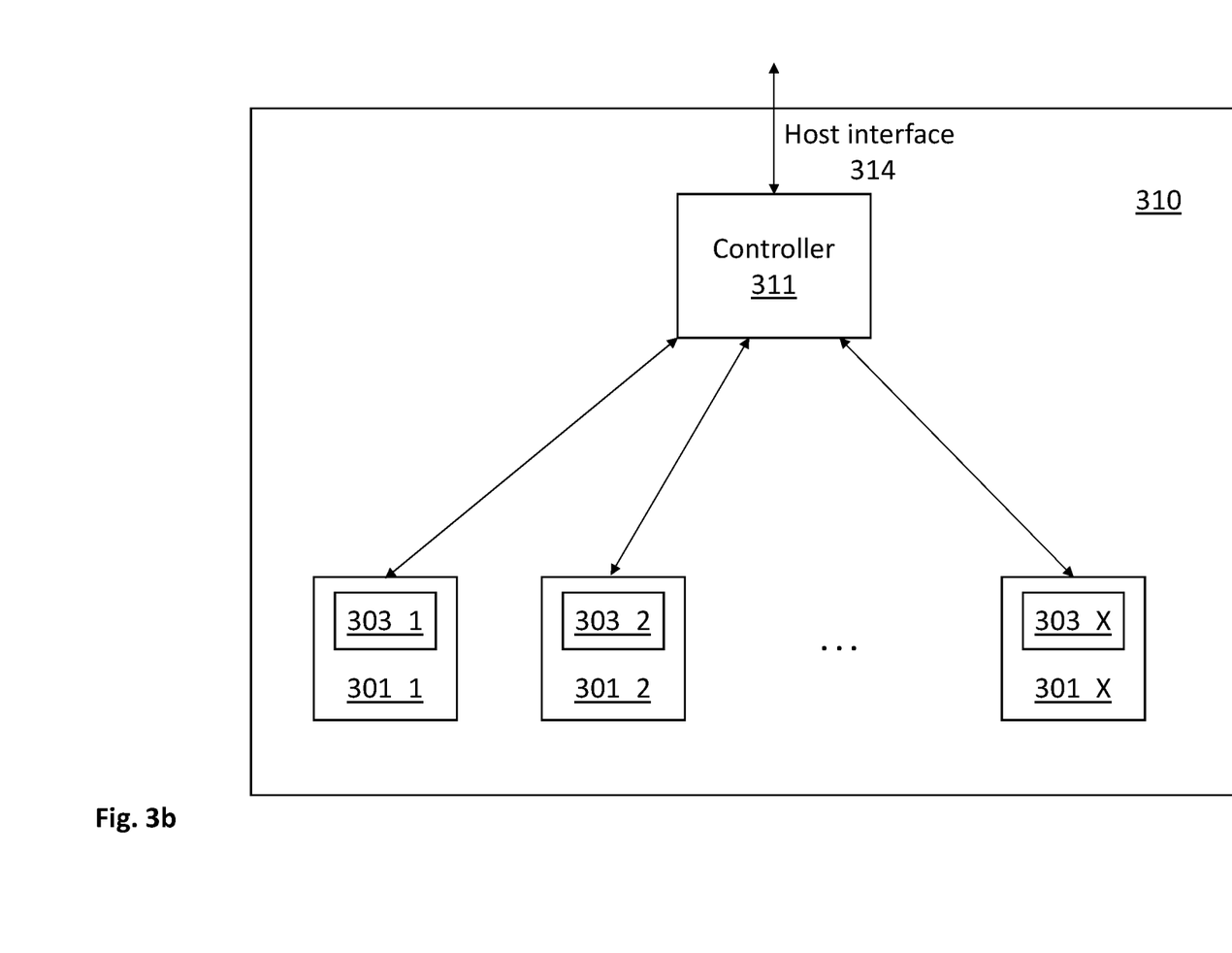
FIG. 3b shows a solid state drive.

FIG. 3b shows a non volatile memory device 310 such as a memory module (e.g., a dual in-line memory (DIMM), a stacked memory module, etc.) or mass storage device (e.g., solid state drive (SDD)) having multiple flash memory chips 301_1 through 301_X whose blocks of flash cells are programmed in reverse order (top-to-bottom) and subjected to top-to-bottom extended verification recovery and bottom side seeding (with or without top side seeding) as described at length above. As observed in FIG. 3b, the non volatile memory device 310 includes a controller 311, and, each of the flash memory chips 301_1 through 301_X include an embedded controller logic circuit 303_1 through 303_X. Here, the device controller 310 and/or the embedded flash memory chip controller logic circuits 303 are designed to cause the flash chips 301 to perform reverse order programming, top-to-bottom extended verification recovery (with top-to-bottom programming) and bottom side seeding (with or without top side seeding). The host interface 314 is commonly used to receive commands from (e.g., a peripheral control hub of) a larger host system such as a computer.

The device controller 311 and/or embedded controller logic circuits 303 can be implemented with dedicated hardwired logic circuitry (e.g., Application Specific Integrated Circuit (ASIC) cell), programmable logic circuitry (e.g., Field Programmable Gate Array (FPGA) logic circuitry), and/or logic circuitry designed to execute some form of program code (e.g., firmware) such as an embedded processor.

Figure 4:
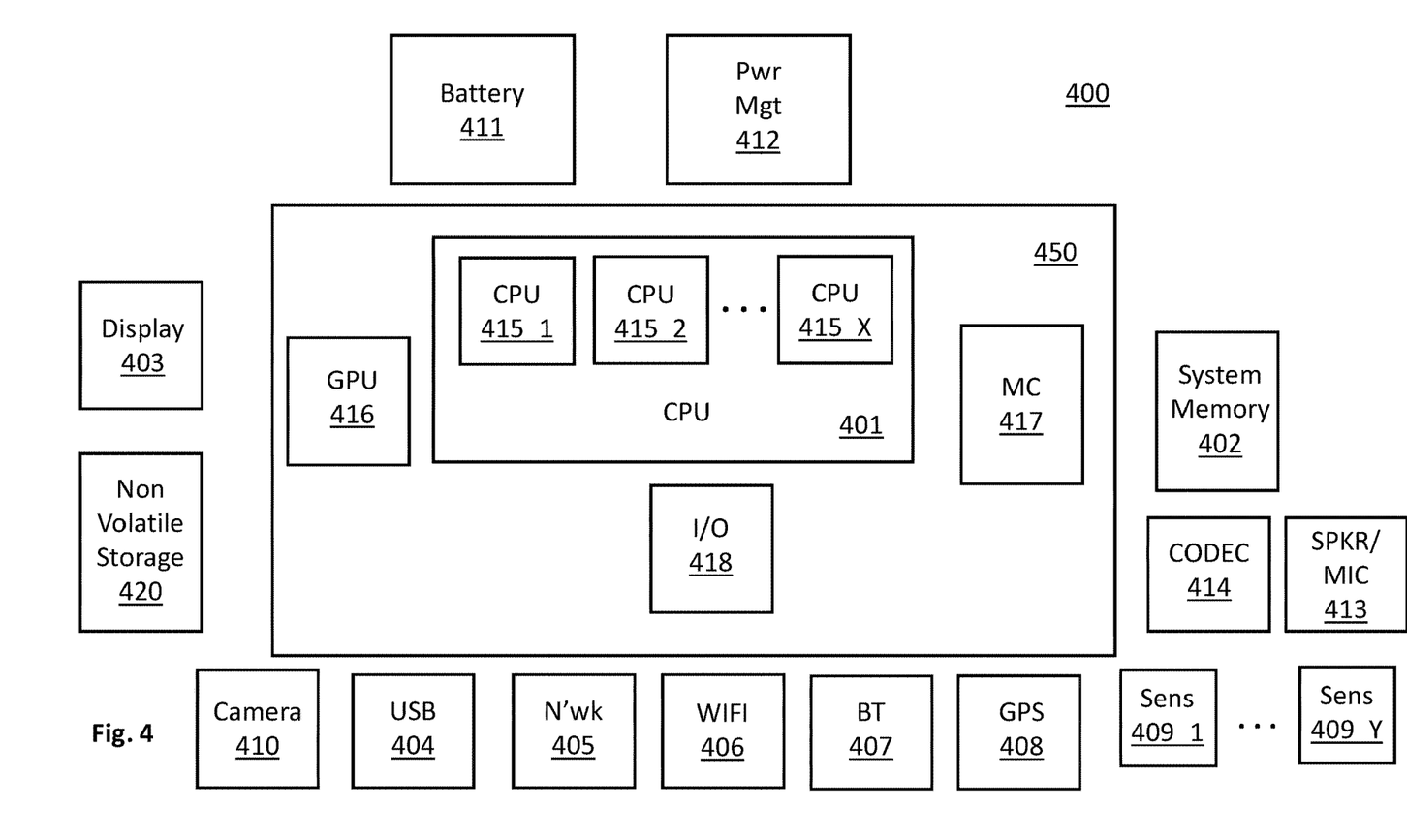
FIG. 4 shows a computing system.

FIG. 4 provides an exemplary depiction of a computing system 400 (e.g., a smartphone, a tablet computer, a laptop computer, a desktop computer, a server computer, etc.). As observed in FIG. 4, the basic computing system 400 may include a central processing unit 401 (which may include, e.g., a plurality of general-purpose processing cores 415_1 through 415_X) and the main memory controller 417 disposed on a multi-core processor or applications processor, system memory 402, a display 403 (e.g., touchscreen, flat-panel), a local wired point-to-point link (e.g., USB) interface 404, various network I/O functions 405 (such as an Ethernet interface and/or cellular modem subsystem), a wireless local area network (e.g., WiFi) interface 406, a wireless point-to-point link (e.g., Bluetooth) interface 407 and a Global Positioning System interface 408, various sensors 409_1 through 409_Y, one or more cameras 410, a battery 411, a power management control unit 412, a speaker and microphone 413 and an audio coder/decoder 414.

An application processor or multi-core processor 450 may include one or more general-purpose processing cores 415 within its CPU 401, one or more graphical processing units 416, a memory management function 417 (e.g., a memory controller) and an I/O control function 418. The general-purpose processing cores 415 typically execute the system and application software of the computing system. The graphics processing unit 416 typically executes graphics intensive functions to, e.g., generate graphics information that is presented on the display 403. The memory control function 417 interfaces with the system memory 402 to write/read data to/from system memory 402.

Any of the system memory 402 and/or non volatile storage 420 (also referred to as mass storage 420) can be composed with a three dimensional non volatile random access memory composed, e.g., of an emerging non volatile storage cell technology. Examples include Optane memory from Intel Corporation, QuantX from Micron Corporation, and/or other types of resistive non-volatile memory cells integrated amongst the interconnect wiring of a semiconductor chip (e.g., resistive random access memory (ReRAM), ferroelectric random access memory (FeRAM), spin transfer torque random access memory (STT-RAM), etc.). Mass storage 420 at least can also be composed of flash memory (e.g., NAND flash).

The mass storage 420, or conceivably even system memory 402 if composed of non volatile (e.g., flash) memory, could be implemented with non volatile memory chips that program their storage cells in a direction along a stack of storage cells having less word line disturbances than the opposite direction and where the column connecting the cells in the stack is cleaned of charge in the same direction that the cells are programmed as described at length above, and where, seed charge prior to a next program iteration enters an end of the stack that is pointed to by the direction as described at length above.

Each of the touchscreen display 403, the communication interfaces 404-407, the GPS interface 408, the sensors 409, the camera(s) 410, and the speaker/microphone codec 413, 414 all can be viewed as various forms of I/O (input and/or output) relative to the overall computing system including, where appropriate, an integrated peripheral device as well (e.g., the one or more cameras 410). Depending on implementation, various ones of these I/O components may be integrated on the applications processor/multi-core processor 450 or may be located off the die or outside the package of the applications processor/multi-core processor 450. The power management control unit 412 generally controls the power consumption of the system 400.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a non-volatile memory chip, comprising:
an interface to receive access commands;
a three dimensional array of non-volatile storage cells; and,
a controller to orchestrate removal of charge in a column of stacked ones of the non-volatile storage cells after a verification process that determined whether or not a particular cell among the column of stacked ones of the non-volatile storage cells was programmed with a correct charge amount, wherein the removal of the charge pushes the charge out of the column by changing respective word line potentials along a particular direction along the column, wherein, the column of stacked ones of the non-volatile storage cells are programmed in the particular direction, wherein, disturbance of neighboring cells during programming is less along the particular direction than a direction opposite that of the particular direction, wherein, the controller is also to orchestrate seeding from both ends of the column with second charge that is opposite in polarity to the charge, and wherein, for the seeding, the controller is to ramp up a first voltage applied to a first respective outer node of a first transistor that is coupled to a source end of the column at a first respective inner node of the first transistor, ramp up a second voltage applied to a second respective outer node of a second transistor that is coupled to an end of the column opposite the source end at a second respective inner node of the second transistor, turn on the first transistor and turn on the second transistor.

2. The apparatus of claim 1 wherein the cells are flash cells.

3. The apparatus of claim 1 wherein the particular direction is away from a bit line that is coupled to the second outer node of the second transistor.

4. The apparatus of claim 3 wherein the end of the column opposite the source end is a top end of the column, wherein, the top end is farther away from the non-volatile memory chip's substrate than a bottom end of the column.

5. The apparatus of claim 1 wherein the particular direction is toward a bottom end of the column, wherein, the bottom end is closer to the non-volatile memory chip's substrate than a top end of the column.

6. The apparatus of claim 1 wherein the second charge is positive charge.

7. The apparatus of claim 1 wherein the controller is at least partially implemented with logic circuitry.

8. An apparatus, comprising:
a non-volatile memory chip, comprising:
an interface to receive access commands;
a three dimensional array of non-volatile storage cells; and,
a controller to orchestrate seeding a column of stacked ones of the non-volatile storage cells with charge in preparation for a next program iteration after a verification process that determined whether or not a particular cell among the column of stacked ones of the non-volatile storage cells was programmed with a correct charge amount, wherein, the column of stacked ones of the non-volatile storage cells are programmed in a first direction along the column on a word line by word line basis, wherein, the first direction points toward a source end of the column, wherein the seeding is injected from both ends of the column, wherein, disturbance of neighboring cells during programming is less along the first direction than a second direction opposite that of the first direction, and wherein, for the seeding, the controller is to ramp up a first voltage applied to a first respective outer node of a first transistor that is coupled to the source end of the column at a first respective inner node of the first transistor, ramp up a second voltage applied to a second respective outer node of a second transistor that is coupled to an end of the column opposite the source end at a second respective inner node of the second transistor, turn on the first transistor and turn on the second transistor.

9. The apparatus of claim 8 wherein the cells are flash cells.

10. The apparatus of claim 8 wherein the first direction is away from a bit line that is coupled to the second outer node of the second transistor.

11. The apparatus of claim 10 wherein the end of the column opposite the source end is farther away from a semiconductor substrate of the non-volatile memory chip than the source end of the column.

12. The apparatus of claim 8 wherein the first direction is toward a semiconductor substrate of the non-volatile memory chip.

13. A computing system, comprising:
a plurality of processing cores;
a peripheral control hub;
a system memory controller; and,
a non-volatile memory device coupled to one of the peripheral control hub and the system memory controller, the non-volatile memory device comprising a non-volatile memory chip, the non-volatile memory chip, comprising:
an interface to receive access commands;
a three dimensional array of non-volatile storage cells; and
a controller to orchestrate removal of charge in a column of stacked ones of the non-volatile storage cells after a verification process that determined whether or not a particular cell among the column of stacked ones of the non-volatile storage cells was programmed with a correct charge amount, wherein the removal of the charge pushes the charge out of the column by changing respective word line potentials along a particular direction along the column, wherein, the column of stacked ones of the non-volatile storage cells are programmed in the particular direction, wherein, disturbance of neighboring cells during programming is less along the particular direction than a direction opposite that of the particular direction, and wherein, the controller is also to orchestrate seeding from both ends of the column with second charge that is opposite in polarity to the charge, and wherein, for the seeding, the controller is to ramp up a first voltage applied to a first respective outer node of a first transistor that is coupled to a source end of the column at a first respective inner node of the first transistor, ramp up a second voltage applied to a second respective outer node of a second transistor that is coupled to an end of the column opposite the source end at a second respective inner node of the second transistor, turn on the first transistor and turn on the second transistor.

14. The computing system of claim 13 wherein the cells are flash cells.

15. The computing system of claim 13 wherein the particular direction is away from a bit line that is coupled to the second outer node of the second transistor.

16. The computing system of claim 15 wherein the end of the column opposite the source end is a top end of the column, wherein, the top end is farther away from the non-volatile memory chip's substrate than a bottom end of the column.

17. The computing system of claim 13 wherein the particular direction is toward a bottom end of the column, wherein, the bottom end of the column is closer to the non-volatile memory chip's substrate than a top end of the column.

* * * * *